United States Patent [19]

Moyal

[11] Patent Number: 5,400,027
[45] Date of Patent: Mar. 21, 1995

[54] LOW VOLTAGE DIGITAL-TO-ANALOG CONVERTER WITH IMPROVED ACCURACY

[75] Inventor: Miki Moyal, Austin, Tex.

[73] Assignee: Advanced Micro Devices, Inc., Sunnyvale, Calif.

[21] Appl. No.: 74,914

[22] Filed: Jun. 10, 1993

[51] Int. Cl.⁶ .............................................. H03M 1/66
[52] U.S. Cl. ....................................... 341/144; 341/136
[58] Field of Search .................... 341/135, 136, 144

[56] References Cited

U.S. PATENT DOCUMENTS

| | | | |
|---|---|---|---|
| 4,573,005 | 2/1986 | van de Plassche | 323/315 |
| 4,583,076 | 4/1986 | Luschnig | 341/144 |
| 4,982,192 | 1/1991 | Murooka | 341/127 |
| 5,070,332 | 12/1991 | Kaller et al. | 341/156 |

Primary Examiner—Marc S. Hoff
Attorney, Agent, or Firm—Foley & Lardner

[57] ABSTRACT

An apparatus for generating an analog output signal representative of a digital input signal, which digital input signal is received as a plurality of bits. The apparatus includes a current branch array for establishing a plurality of output current branches and a reference current branch. The current branch array includes a first, a second, and a third electrical node. Each respective output current branch is responsive to a respective bit to switchably connect the respective output current branch intermediate the first and the second electrical node when the respective bit is a first state and to switchably connect the respective output current branch intermediate the first and the third electrical node when the respective bit is in a second state. Each respective output current branch and the reference current branch includes a respective switching device which responds to a switching signal to enable current flow through the first electrical node. The apparatus further includes a switching control device for controlling generation of the switching signal. The switching control device has a first input operatively connected with the second electrical node and a second input operatively connected with the reference current branch. The switching control device generates the switching signal and conveys the switching signal to each of the respective switching devices when the first input and the second input have a predetermined mutual relationship.

4 Claims, 5 Drawing Sheets

LOW VOLTAGE DIGITAL-TO-ANALOG CONVERTER WITH IMPROVED ACCURACY

BACKGROUND OF THE INVENTION

The present invention is directed to an apparatus for generating an analog output signal representative of a digital input signal, which digital input signal is received by the apparatus as a plurality of bits conveyed by a plurality of bit paths. Parameter generating apparatuses, such as current mirrors, are often employed to provide a predetermined parameter to various portions of a device. Specifically, in digital-to-analog conversion apparatuses, current mirrors are often employed to generate a reference current and a plurality of output currents or characteristic currents in respective output current branches for providing analog signals responsive to respective digital bits comprising the received digital input signal.

In newer circuit designs, a lower supply voltage, on the order of 3.0 volts or less, is employed. As a consequence, the digital-to-analog converter design techniques previously relied upon (which employed a higher supply voltage—on the order of 5.0 volts) can no longer be used.

Current mirrors are generally not temperature stable. That is, the respective output or characteristic currents do not track with the reference currents as temperature changes, and the device is sensitive to a mismatch of threshold or trigger voltages of the various transistors employed therein for establishing the reference current and the output or characteristic currents.

One prior art solution to such temperature-related instability was to "stack" multiple current mirror devices, generally two high, in a manner such that a switching transistor in the first output stage effectively shields the switching transistor in the second output stage so that the source of the first stage transistor and the drain of the second stage transistor tracked together, thereby generating a temperature-stable output current in the second stage output transistor. However, the newer digital-to-analog converter designs which employ a lower supply voltage are not amenable to such a "stacked" device since the lower power supplied does not accommodate such multiple devices.

There is, therefore, a need for a stable, more accurate digital-to-analog converter apparatus which can accommodate a lower supply voltage.

SUMMARY OF THE INVENTION

The invention is an apparatus for generating an analog output signal representative of a digital input signal, which digital input signal is received by the apparatus as a plurality of bits conveyed by a plurality of bit paths. The apparatus includes a current branch array for establishing a plurality of output current branches and a reference current branch. The current branch array includes a first electrical node, a second electrical node, and a third electrical node. Each respective output current branch of the plurality of output current branches is operatively coupled with a respective bit path of the plurality of bit paths. Each respective output current branch is responsive to a respective bit of the plurality bits comprising the digital input signal to selectively switchably connect the respective output current branch intermediate the first electrical node and the second electrical node when the respective bit is a first state and to selectively switchably connect the respective output current branch intermediate the first electrical node and the third electrical node when the respective bit is in a second state.

The reference current branch includes a current generator for generating a reference current and is connected with the first electrical node. Each respective output current branch and the reference current branch includes a respective switching device which responds to a switching signal to enable current flow through the first electrical node.

The apparatus further includes an output circuit for generating the analog output signal; the output circuit is operatively connected with the third electrical node. The apparatus still further includes a switching control device for controlling generation of the switching signal. The switching control device has a first switching control input operatively connected with the second electrical node and a second switching control input operatively connected with the reference current branch.

The switching control device generates the switching signal and conveys the switching signal to each of the respective switching devices when the first switching control input and the second switching control input have a predetermined mutual relationship.

It is, therefore, an advantage of the present invention to provide a digital-to-analog signal converting apparatus which is temperature-stable without requiring "stacking" of multiple devices.

It is a further advantage of the present invention to provide a digital-to-analog signal converting apparatus which is temperature-stable and accommodates lower supply of voltages on the order of 3.0 volts or less.

Further objects and features of the present invention will be apparent from the following specification in claims when considered in connection with the accompanying drawings illustrating the preferred embodiment of the invention.

DETAILED DESCRIPTION OF THE INVENTION

Figures 1, 2:
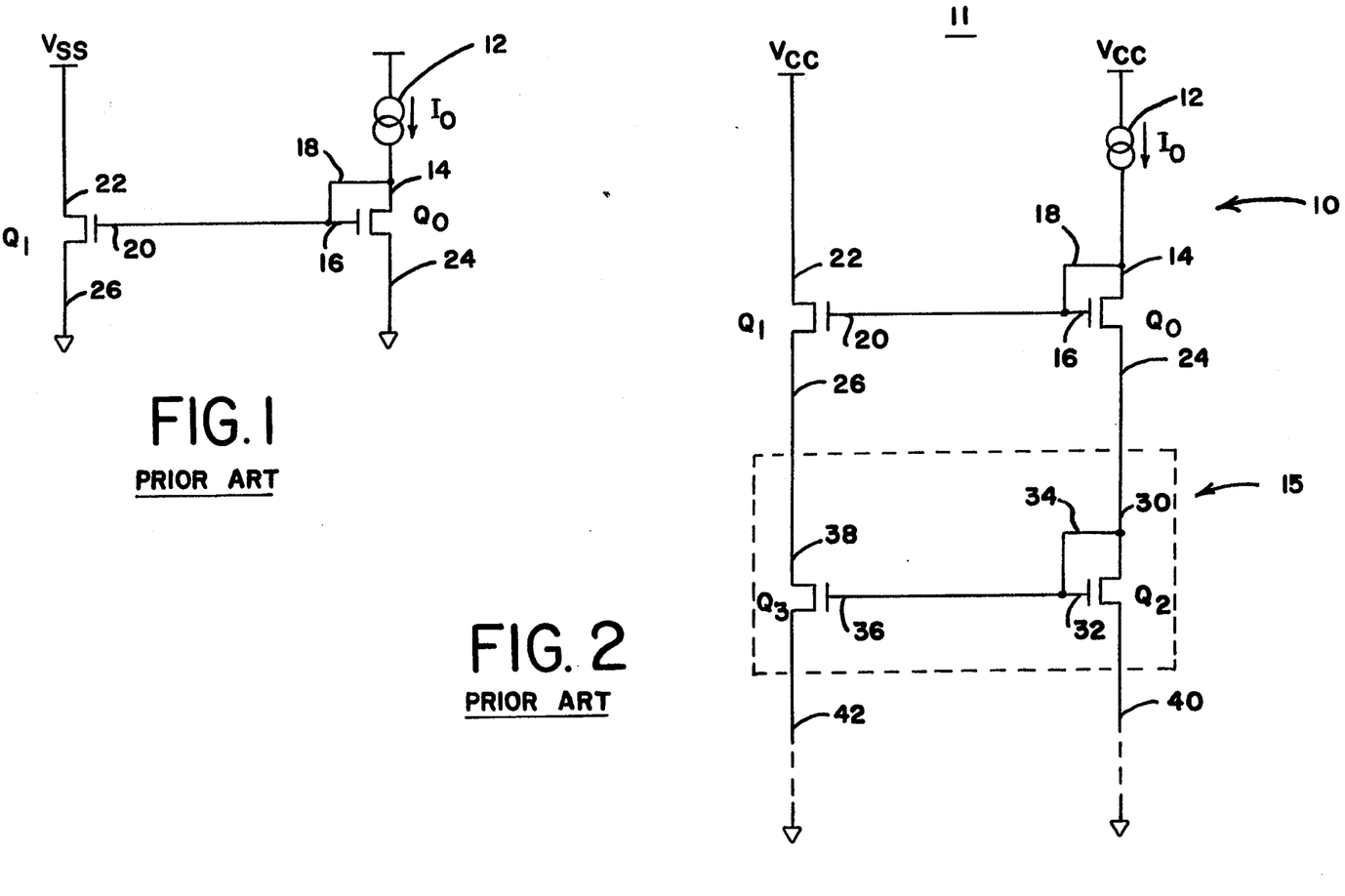
FIG. 1 is a schematic diagram of a prior art current mirror.
FIG. 2 is a schematic diagram of a prior art current mirror in a "stacked" configuration.

FIG. 1 is a schematic diagram of a prior art current mirror. In FIG. 1, a current mirror apparatus 10 is illustrated including a current generator 12 generating a reference current $I_0$. Also included are switching field effect transistors (FET) $Q_0$ and $Q_1$. FET $Q_0$ has a drain 14, a gate 16, and a source 24. Drain 14 of FET $Q_0$ is connected with gate 16 via a line 18. FET $Q_1$ has a drain 22, a gate 20, and a source 26. Gate 16 of FET $Q_0$ is connected with gate 20 of FET $Q_1$. Drain 22 of FET $Q_1$ is connected with a supply voltage $V_{ss}$. So long as the threshold trigger voltage of FET $Q_1$ equals the threshold trigger voltage of FET $Q_0$ and so long as the current gains of FET $Q_0$ and FET $Q_1$ are equal, the output current present at source 24 of FET $Q_0$ will equal the output current at source 26 of FET $Q_1$. However, prior art devices such as those illustrated in FIG. 1 are generally not temperature-stable. Thus, when temperature rises, the threshold trigger voltage of FET $Q_0$ drops but, since drain 22 of FET $Q_1$ is directly connected with supply voltage $V_{ss}$, the threshold trigger voltage of FET $Q_1$ remains constant. Thus, the output current at source 24 of FET $Q_0$ will not equal the output current at source 26 of FET $Q_1$.

FIG. 2 is a schematic diagram of a prior art current mirror in a "stacked" configuration. In FIG. 2, like reference numerals are employed to identify like elements described in FIG. 1. In FIG. 2, a "stacked" current mirror apparatus 11 is illustrated including a current mirror device 10 substantially the same as illustrated and described in connection with FIG. 1, and a second current mirror device 15. Second current mirror device 15 is comprised of an FET $Q_2$ and an FET $Q_3$. FET $Q_2$ has a drain 30, a gate 32, and a source 40. FET $Q_3$ has a drain 38, a gate 36, and a source 42. Drain 30 of FET $Q_2$ is connected with source 24 of FET $Q_0$ and, further, is connected with gate 32 of FET $Q_2$ via a line 34. Gate 32 of FET $Q_2$ is connected with gate 36 of FET $Q_3$. Drain 38 of FET $Q_3$ is connected with source 26 of FET $Q_1$. Thus, the outputs of current mirror 11 are generated at source 40 of FET $Q_2$ and source 42 of FET $Q_3$.

In the configuration of current mirror device 11 illustrated in FIG. 2, FET $Q_1$ effectively acts as a shield for FET $Q_3$. That is, drain 22 of FET $Q_1$ is forced to a predetermined positive voltage, supply voltage $V_{cc}$. However, source 26 of FET $Q_1$ is equal to drain 38 of FET $Q_3$ and, similarly, source 24 of FET $Q_0$ is equal to drain 30 of FET $Q_2$. Because of such source-drain equality, current flow from drain 38 to source 42 equals current flow from drain 30 to source 40 so that output currents at source 42 and source 40 are equal regardless of differences in temperature which may be experienced by current mirror device 11 (presuming that the current gains of $Q_0$ and $Q_1$ are equal and that the current gains of $Q_2$ and $Q_3$ are equal).

Figure 3:
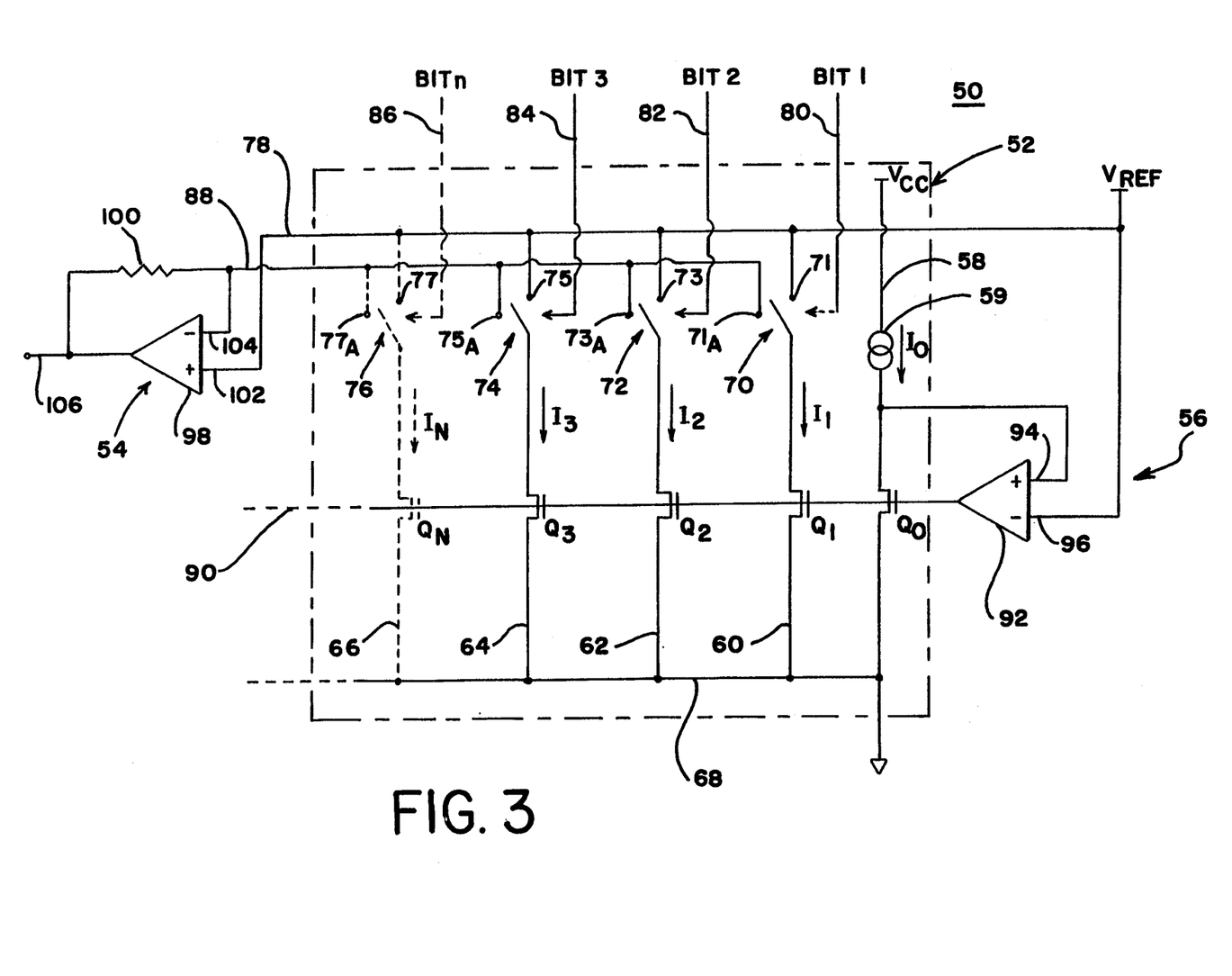
FIG. 3 is a schematic diagram of a digital-to-analog converting apparatus according to the present invention.

FIG. 3 is a schematic diagram of a digital-to-analog converting apparatus according to the present invention. In FIG. 3, a digital-to-analog converting apparatus 50 is illustrated, including a current mirror array 52, an output circuit 54 and a triggering circuit 56. Current mirror array 52 includes a reference current circuit branch 58, a first characteristic parameter or output circuit branch 60, a second characteristic parameter or output circuit branch 62, a third characteristic parameter or output current circuit branch 64, and an nth characteristic parameter or output current circuit branch 66. The nth characteristic parameter circuit branch 66 is illustrated in phantom to indicate that the embodiment of digital-to-analog converting apparatus 50 illustrated in FIG. 3 is not limited to a particular number of bits but may be adapted to accommodate any number of bits.

Each characteristic parameter circuit branch 60, 62, 64, 66 includes a switching device 70, 72, 74, 76, respectively. The bits (bit 1, bit 2, bit 3, bit n) comprising the digital signal to be converted to an analog output signal by digital-to-analog converting apparatus 50 are received by digital-to-analog converting apparatus 50 on a plurality of bit lines: bit 1 is received via bit line 80, bit 2 is received via bit line 82, bit 3 is received via bit line 84, and bit n is received via bit line 86. Each respective switching device 70, 72, 74, 76 will respond to its bit signal received via its respective bit line 80, 82, 84, 86, so that when the respective received bit is in a first state, respective switching device 70, 72, 74, 76 will connect its respective characteristic parameter circuit branch 60, 62, 64, 66 with a first pole 71, 73, 75, 77. In such manner, when respective bits (bit 1, bit 2, bit 3, bit n) are at a first state, respective characteristic parameter circuit branches 60, 62, 64, 66 are connected intermediate a first electrical node 68 and a second electrical node 78. When a respective bit (bit 1, bit 2, bit 3, bit n) is received via its respective bit line 80, 82, 84, 86 in a second state, the respective affected switching device 70, 72, 74, 76 connects its respective characteristic parameter circuit branch 60, 62, 64, 66 with a second pole 71a, 73a, 75a, 77a. In such a configuration, a respective characteristic parameter circuit branch 60, 62, 64, 66 is, in response to a bit received in a second state via a bit line 80, 82, 84, 86, connected intermediate first electrical node 68 and a third electrical node 88.

Each characteristic parameter circuit branch 60, 62, 64, 66 includes a switching FET; reference current circuit 58 also contains a switching FET. Thus, reference current circuit branch 58 contains FET $Q_0$, characteristic parameter circuit branch 60 contains FET $Q_1$, characteristic parameter circuit branch 62 contains FET $Q_2$, characteristic parameter circuit branch 64 contains FET $Q_3$, and characteristic parameter circuit branch 66 contains FET $Q_n$. Reference current circuit branch 58 also contains a current generator 59. Second electrical node 78 is connected to a power supply generating a reference voltage $V_{ref}$. Current generator 59 is connected with a power supply delivering a power supply voltage $V_{cc}$ greater than reference voltage $V_{ref}$ in order to ensure current flow for proper operation of current mirror array 52.

Each respective FET, $Q_0$, $Q_1$, $Q_2$, $Q_3$ and $Q_n$ responds to a switching or triggering signal delivered via a trigger line 90 from triggering circuit 56.

Triggering circuit 56, in this preferred embodiment, includes an operational amplifier 92 having its noninverting input 94 connected with reference current circuit branch 58 and having its inverting input 96 connected with second electrical node 78. Output circuit 54 is preferably comprised of an operational amplifier 98 and a resistor 100. Noninverting input 102 of operational amplifier 98 is connected with second electrical node 78 and inverting input 104 of operational amplifier 98 is connected with third electrical node 88. Thus, currents flowing through respective switching nodes 71a, 73a, 75a, 77a, in response to bits received in a second state via bit lines 80, 82, 84, 86 will additively be conveyed through third electric node 88 and through resistor 100 to output 106.

Thus, if the respective gains of switching FETs $Q_0$, $Q_1$, $Q_2$, $Q_3$, $Q_n$ are correctly established, each current respectively flowing through switching node 71a, 73a, 75a, 77a will be an analog representation of its respective bit (bit 1, bit 2, bit 3, bit n).

For example, where n=4, the gains of the respective switching FETs $Q_1$, $Q_2$, $Q_3$, $Q_n$ are chosen to establish the respective currents flowing in respective characteristic parameter circuit branches 60, 62, 64, 66 in a manner whereby current $I_2$ equals $2I_1$; current $I_3$ equals $2I_2$; and current $I_4$ equals $2I_3$; then currents $I_1$, $I_2$, $I_3$, $I_n$ provide an analog representation of the significance of the respective bits (bit 1, bit 2, bit 3, bit 4) as they represent a binary digital signal. Accordingly, the cumulative current occurring at third electrical node 88 and flowing through resistor 100 comprises an analog representation of the selected bits in the second state.

Figure 4:
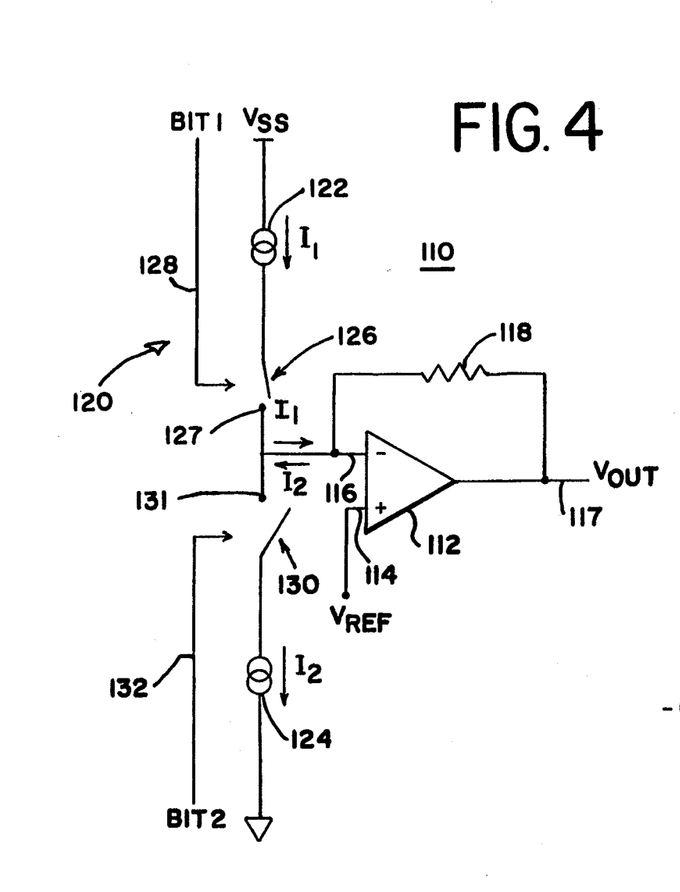
FIG. 4 is a schematic diagram of an output section of a bi-directional current mirror.

FIG. 4 is a schematic diagram of an output section of a bi-directional current mirror. In FIG. 4, an output circuit 110 is illustrated comprising an operational amplifier 112 with its noninverted input 114 coupled to a voltage reference source $V_{ref}$ and its inverted input 116 coupled to a current generating circuit 120 responsive to digital signal bits. Current generating circuit 120 is intended to represent a reference parameter array such as current mirror array 52 of FIG. 3 by way of illustration to explain the operation of output circuit 110. A noninverting input 116 is also connected to output 117 of operational amplifier 112 through a resistor 118.

Current generating circuit 120 includes a first current generator 122 for generating a current $I_1$ and a second current generator 124 for generating current $I_2$. A first bit, bit 1, actuates a switching device 126 via a bit line 128 to effect connection of inverting input 116 with a switch pole 127. A second switching device 130 is responsive to a bit 2 delivered via a bit line 132 to effect connection of inverting input 116 with a switch pole 131.

Figure 5:
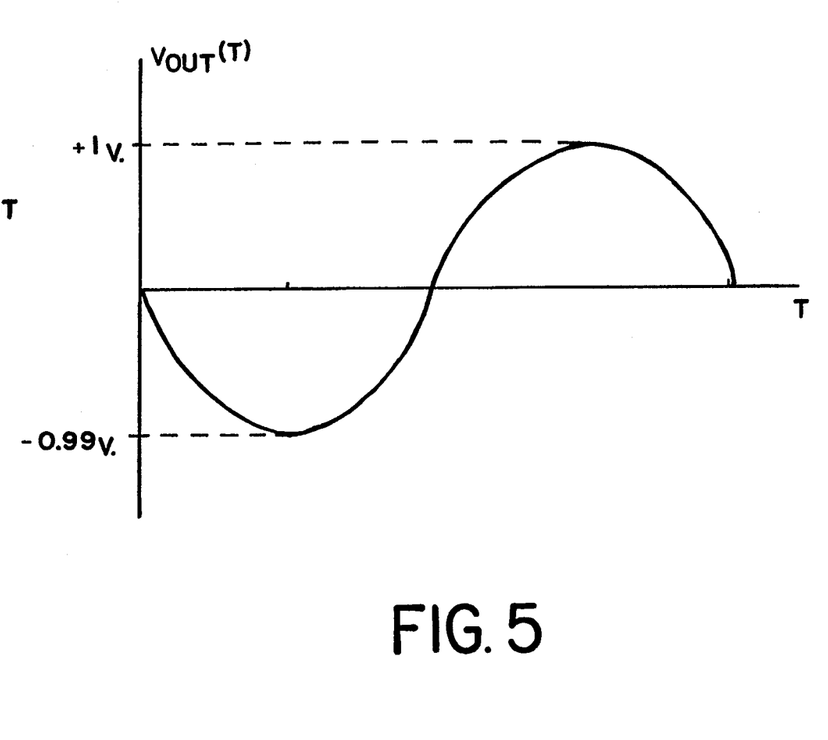
FIG. 5 is a schematic diagram of an output signal from a bi-directional current mirror.

FIG. 5 is a schematic diagram of an output signal from a bi-directional current mirror. FIG. 5 is a typical representation of the output voltage $V_{out}$ as a function of time (t) and reflects the state of many circuits involving bi-directional current flow such as is present in the apparatus illustrated in FIG. 4. In the apparatus illustrated in FIG. 4, $I_1$ flows in a first direction and $I_2$ flows in a second direction so that bit 1 can provide, as illustrated in FIG. 5 for example, a $V_{out}$ at output 117 (FIG. 4) of 1 volt. In contrast actuation of switch 130 (in lieu of switch 126) in response to bit 2 being at a predetermined state on bit line 132 and effecting connection of current generator 124 with switch pole 131 with the result that $I_2$ flows to create a $V_{out}$ of minus 0.99 volts. Thus, the amplitude of $V_{out}$ at output 117 is different, depending upon the direction of current flow.

Figure 6:
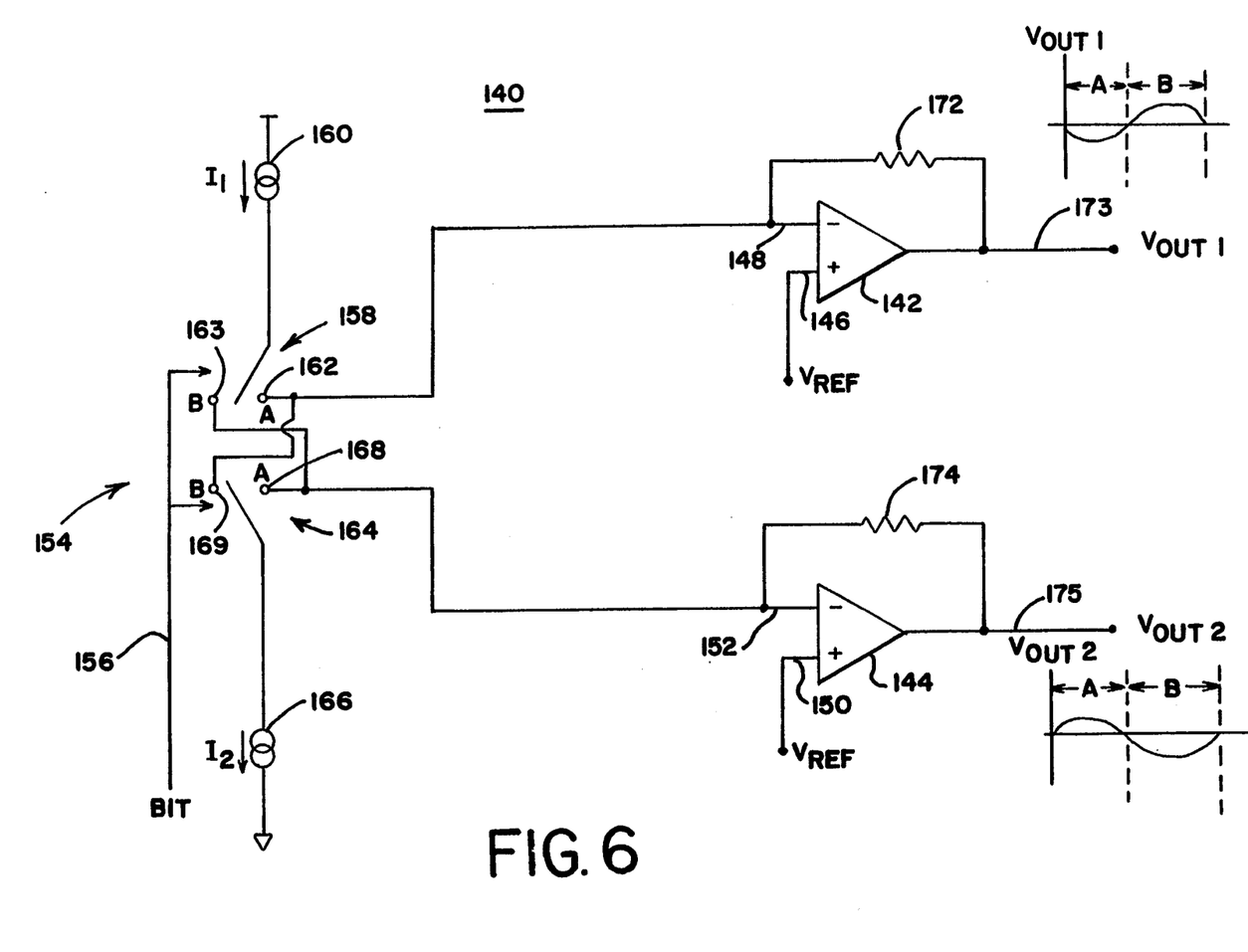
FIG. 6 is a schematic diagram of an improved output section of a bi-directional current mirror device according to the present invention.

FIG. 6 is a schematic diagram of an improved output section of a bi-directional current mirror device according to the present invention. In FIG. 6, an output circuit 140 is illustrated as including an operational amplifier 142 and an operational amplifier 144. Noninverting input 146 of operational amplifier 142 is connected to a reference voltage $V_{ref}$ and inverting input 148 is connected with a current generating circuit 154 similar to current generating circuit 120 of FIG. 4. However, current generating circuit 154 illustrates only a single bit input through a bit line 156. This is to indicate that the bit input conveyed over bit line 156 is a signed bit which in its first signed state causes switching devices 158, 164 to connect current generators 160, 166 into output circuit 140 in a first state (State A) during period A of $I_1$ and $I_2$. Thus, a bit input received via bit line 156 during period A will connect current generator 160 with switching pole 162 and will connect current generator 166 with switching pole 168. Similarly, in its second signed state, the bit signal conveyed over bit line 156 causes switching devices 158, 164 to connect current generators 160, 166 into output circuit 140 in a second state (State B) during period B of $I_1$ and $I_2$. Thus, a bit input received via bit input line 156 during period B will connect current generator 160 with switching pole 163 and will connect current generator 166 with switching pole 169. Noninverting input 150 of operational amplifier 144 is connected with a reference voltage $V_{ref}$. Inverting input 148 of operational amplifier 142 is connected with switch poles 162, 169 and inverting input 152 of operational amplifier 144 is connected with switch poles 163, 168. Inverting input 148 of operational amplifier 142 is connected with output 173 via a resistor 172 and inverting input 152 of operational amplifier 144 is connected with output 175 via a resistor 174. When $I_1$, $I_2$ are connected with output circuit 140 in response to the signed bit input in State A, $V_{out}$ is calculated as follows: (presuming, by way of example, the peak values for $V_{out}$ illustrated in FIG. 5 and observing the A–B phases of $V_{out1}$ and $V_{out2}$ illustrated in FIG. 6)

$$V_{out} = \frac{V_{out1} - V_{out2}}{2}$$
$$= \frac{(1.0) - (-0.9)}{2}$$
$$= \frac{1.9}{2}$$

When $I_1$, $I_2$ are connected with output circuit 140 in response to the signed bit in State B, $V_{out}$ is calculated as follows: (using the same exemplary values from FIG. 5)

$$V_{out} = \frac{V_{out1} - V_{out2}}{2}$$
$$= \frac{(-.9) - (+1)}{2}$$
$$= \frac{-1.9}{2}$$

Thus, the balanced output structure employed in output circuit 140 negates the errors which would be experienced by the structure of FIG. 4 in the presence of an output signal characteristic such as the signal illustrated in FIG. 5.

Figure 7:
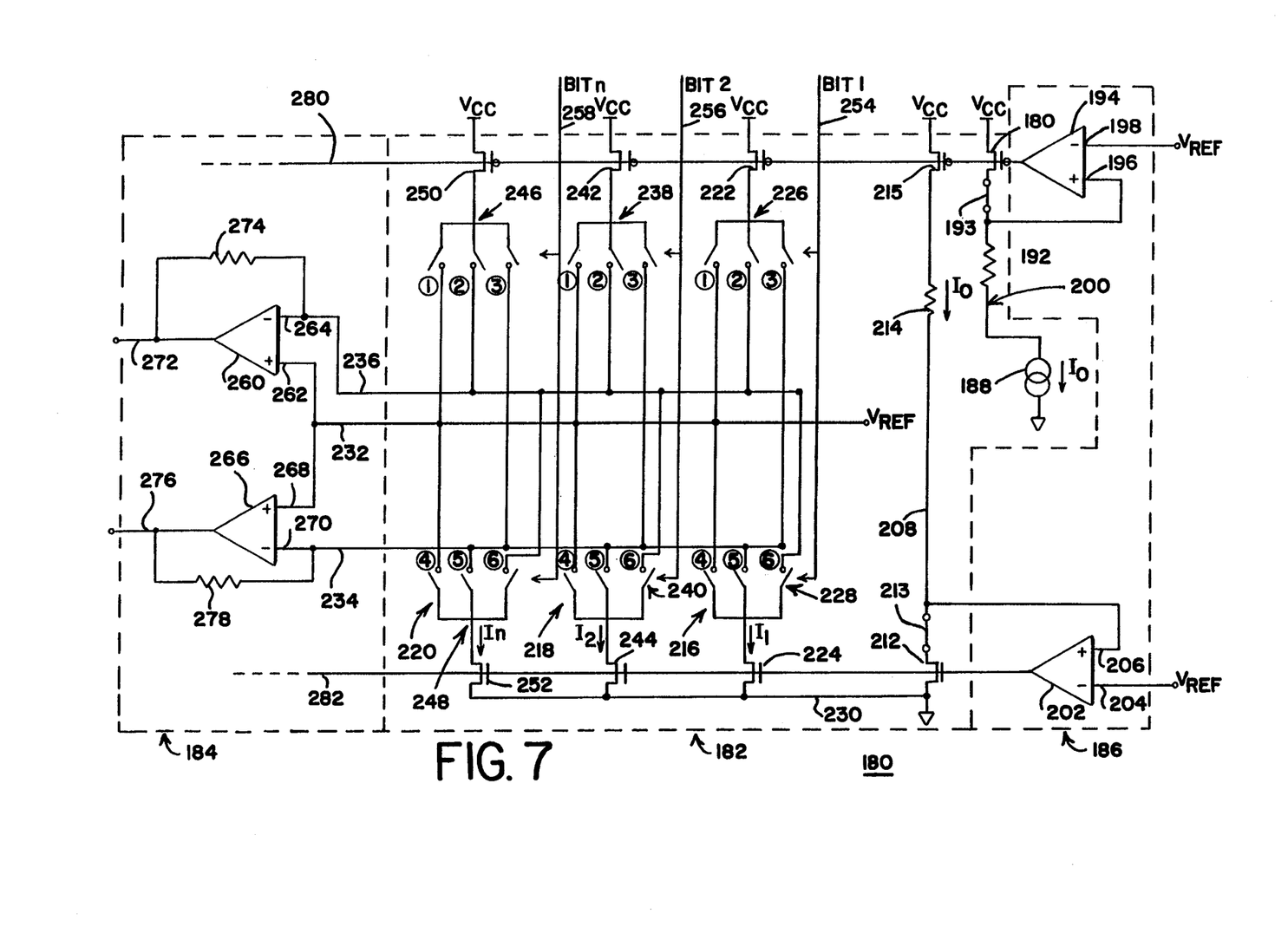
FIG. 7 is a schematic diagram of a digital-to-analog converting apparatus accommodating signed bits according to the present invention.

FIG. 7 is a schematic diagram of a digital-to-analog converting apparatus accommodating signed bits according to the present invention. In FIG. 7, a digital-to-analog converting apparatus 180 is illustrated including a current mirror array 182, an output circuit 184, and a triggering circuit 186. Triggering circuit 186 includes a first operational amplifier 194 and a second operational amplifier 202. First operational amplifier 194 has a noninverting input 196 and an inverting input 198. Inverting input 198 is connected with a reference voltage $V_{ref}$ and noninverting input 196 is connected with first reference current circuit branch 200. Second operational amplifier 202 has an inverting input 204 connected with reference voltage $V_{ref}$ and a noninverting input 206.

Current mirror array 182 includes a first reference current circuit branch 200 having a current generator 188 for generating a reference current $I_0$ from a supply voltage $V_{cc}$ through a switching FET 190, a resistor 192, and a dummy switch 193. Dummy switch 193 is intended to be always closed and serves to equalize the drain current of FET 190 with the drain currents of parallel-situated FETs 222, 242, 250 in current mirror array 182.

Current mirror array 182 further includes a second reference current circuit branch 208. Second reference current circuit 208 includes a switching FET 210, a switching FET 212, a resistor 214, and a dummy switch 213. Dummy switch 213 is intended to be always closed and serves to equalize the drain current of FET 212 with the drain currents of parallel-situated FETs 224, 244, 252 in current mirror array 182. Resistor 214 is appropriately sized to establish reference current $I_0$ within second reference current circuit branch 208. Noninverting input 206 to operational amplifier 202 is connected with second reference current circuit branch 208.

Current mirror array 182 also includes characteristic reference current circuit branch arrays 216, 218, 220. Characteristic reference current circuit branch array 216 includes switching FETs 222, 224, a first 3-pole switch 226 and a second 3-pole switch 228. Switch 228 effects connection from a first electrical node 230 through switching FET 224 selectively through switching nodes 4, 5, 6 of switch 228 to a second electrical node 232 or a third electrical node 234 or a fourth electrical node 236. Similarly, switch 226 selectively effects connection between supply voltage $V_{cc}$ through switching FET 222 to second electrical node 232, third electrical node 234, or fourth electrical node 236. Characteristic reference current circuit branch array 218 includes a 3-pole switch 238, a 3-pole switch 240, and FETs 242, 244. Characteristic reference current circuit branch array 220 includes a 3-pole switch 246, a 3-pole switch 248, and FETs 250, 252.

Switches 238, 246 effect similar connections between supply voltage $V_{cc}$ and respective second, third, and fourth electrical nodes 232, 234, 236 as are effected by switch 226. Similarly, switches 218, 220 effect similar connections between first electrical node 230 and respective second, third, and fourth electrical nodes 232, 234, 236 as are effected by switch 228. 3-pole switches 226, 228, 238, 240, 246, 248 are responsive to bits (bit 1, bit 2, bit n) received via bit lines 254, 256, 258. Bits (bit 1, bit 2, bit n) are signed bits so that the response of switches 226, 228, 238, 240, 246, 248 to a given bit (bit 1, bit 2, bit n) is as follows:

| Bit Value | Switch Poles Engaged |
|---|---|
| 0 | 1, 4 |
| 1+ | 2, 5 |
| 1− | 3, 6 |

Output circuit 184 includes an operational amplifier 260 having a noninverting input 262 and an inverting input 264. Output circuit 184 further includes an operational amplifier 266 having a noninverting input 268 and an inverting input 270. Operational amplifier 260 has an output 272 which is connected with inverting input 264 via a resistor 274. Operational amplifier 266 has an output 276 which is connected with inverting input 270 through a resistor 278. Second electrical node 232 is connected between reference voltage $V_{ref}$ and noninverting outputs 262, 268. Third electrical node 234 is connected with inverting input 270 and fourth electrical node 236 is connected with inverting output 264. By way of example, when bit 1 is delivered via bit line 254 as a "0" bit, pole 1 of switch 226 is closed and poles 2, 3 of switch 226 are open. Further, in response to the "0" state of bit 1 delivered via bit line 254, pole 4 of switch 228 is closed and poles 5 and 6 of switch 228 are open. Thus, in response to a "0" state of bit 1 on line 254, characteristic reference current circuit branch 216 provides electrical connection between supply voltage $V_{cc}$ and first electrical node 230 through FET 222, pole 1 of switch 226, pole 4 of switch 228, and FET 224. FETs 190, 210, 222, 242, 250 are preferably PMOS FETs which respond to a trigger signal received on triggering line 280 from operational amplifier 194. FETs 212, 224, 244, and 252 are preferably NMOS FETs which respond to a trigger signal received on triggering line 282 from operational amplifier 202.

Certainly additional bits beyond three can be employed within the spirit of the present invention as indicated by the dotted line extensions of triggering lines 280, 282.

By way of further example, if bit 1 on bit line 254 has a value of "1+", characteristic reference current circuit branch array 216 is established as providing electrical connection intermediate supply voltage $V_{cc}$ and fourth electrical node 236 through FET 222 and pole 2 of switch 226. Further, characteristic reference current circuit branch 216 establishes electrical connection between first electrical node 230 and third electrical node 234 through FET 224 and pole 5 of switch 228.

By way of still further example, if bit 1 delivered on bit line 254 has the value of "1−", characteristic reference current circuit branch array 216 establishes electrical connection between supply voltage $V_{cc}$ and third electrical node 234 through FET 222 and pole 3 of switch 226 as well as establishes electrical connection between first electrical node 230 and fourth electrical node 236 through FET 224 and pole 6 of switch 228.

Characteristic reference current circuit branch arrays 218, 220 respond similarly to similarly valued bits (bit 2, bit n) on received via bit lines 256, 258.

Thus, as in the case with the apparatus illustrated in FIG. 3, if the respective gains of FETs 222, 242, 250, 224, 244, 252 are correctly established, each current respectively flowing through characteristic reference current circuit branch array 216, 218, 220 will be an analog representation of its respective bit (bit 1, bit 2, bit n). For example, if the gains of respective FETs 222, 242, 250 are chosen to establish the respective currents flowing in the respective characteristic representative current circuit branch arrays 216, 218, 220 in a manner whereby $I_2$ equals $2I_1$, and $I_n$ equals $2I_2$; and if the respective gains of FETs 224, 244, 248 are similarly relatively established, then currents $I_1$, $I_2$, $I_n$ provide an analog representation of the significance of the respective bits (bit 1, bit 2, bit n) as they represent a binary digital signal.

The respective switch pole lineup responsive to the bit value (bit 1, bit 2, bit n) will indicate the bit value received so that in the "0" state an analog representation of that bit will be imposed at the noninverting input 262, 268 and output circuit 184. Positively signed bits will effect imposition of an analog representation of their significance at fourth electrical node 236 and, thus, at inverting input 264 of operational amplifier 260 and at output 272 as the summed output currents pass through resistor 274. Similarly, negatively signed bits will effect engagement of poles within the respective switches in the respective characteristic reference current circuit branch arrays 216, 218, 220 to impose their current analog representation of their respective bit significance on third electrical node 234 for application to inverting input 270 of operational amplifier 266 and in output 276 as those summed output currents pass through resistor 278.

Trigger signals are preferably output to triggering line 280 only when the potentials at noninverting input 196 and inverting input 198 of operational amplifier 194 are substantially equal. Similarly, trigger signals are preferably output to triggering line 282 only when noninverting input 206 and inverting input 204 of operational amplifier 202 are substantially equal. In such manner, since non-inverting inputs 196, 206 are connected to supply voltage $V_{cc}$ and respective FETs 222, 242, 250 are also commonly connected with supply voltage $V_{cc}$, the relationship among the various currents $I_0$, $I_1$, $I_2$, $I_n$ (as established by the various gains of FETs 222, 242, 250, 224, 244, 252) are consistent and stable in the face of temperature changes without the necessity of "stacking" current mirror array structures, as was described in connection with FIG. 2.

Thus, digital-to-analog converting apparatus 180 of FIG. 7 accommodates signed bit digital signals utilizing low power (i.e., preferably on the order of $V_{cc}=3.0$ volts or less) in a temperature-stable, reliable, accurate configuration.

It is to be understood that, while the detailed drawings and specific examples given describe preferred embodiments of the invention, there for the purpose of illustration, that the apparatus of the invention is not limited to the precise details and conditions disclosed and that various changes may be made therein without departing from the spirit of the invention which is defined by the following claims:

What is claimed is:

1. An apparatus for generating an analog output signal representative of a digital input signal, said digital input signal being received by the apparatus as a plurality of signed bits conveyed via a plurality of bit paths; the apparatus comprising:

a current branch array means for establishing a plurality of output current branches and a reference current branch; said current branch array means including a first electrical node, a second electrical node, a third electrical node, and a fourth electrical node; each respective output current branch of said plurality of output current branches being operatively coupled with a respective bit path of said plurality of bit paths; each said respective output current branch being responsive to a respective bit of said plurality of bits to selectively switchably connect a supply voltage and said first electrical node with said second electrical node when said respective bit is in a first state; each said respective output current branch being responsive to said respective bit to selectively switchably connect said supply voltage with said fourth electrical node and to selectively switchably connect said first electrical node with said third electrical node when said respective bit is in a second state; each said respective output current branch being responsive to said respective bit to selectively switchably connect said supply voltage with said third electrical node and to selectively switchably connect said first electrical node with said fourth electrical node when said respective bit is in a third state; said reference current branch including a current generator means for generating a reference current, said reference current branch being connected with said first electrical node; each said respective output current branch and said reference current branch including a respective switching means, each said respective switching means responding to a switching signal to enable current flow through said first electrical node;

an output means for generating said analog output signal; said output means being operatively connected with said third electrical node and with said fourth electrical node; and a switching control means for controlling generation of said switching signal; said switching control means having a first switching control input operatively connected with said second electrical node and having a second switching control input operatively connected with said reference current branch; said switching control means generating said switching signal and conveying said switching signal to each said respective switching means when said first switching control input and said second switching control input have a predetermined mutual relationship.

2. An apparatus for generating an analog output signal representative of a digital input signal as recited in claim 1 wherein each said respective current branch generates a respective predetermined current through said respective switching means, each said respective predetermined current being characteristic of its particular said respective bit.

3. An apparatus for generating an analog output signal representative of a digital input signal as recited in claim 2 wherein said output means comprises two operational amplifiers, each of said two operational amplifiers having a first input operatively connected with said second electrical node; one of said two operational amplifiers having a second input operatively connected with said third electrical node; the other of said two operational amplifiers having a second input operatively connected with said fourth electrical node.

4. A digital-to-analog signal converting apparatus; the apparatus comprising:

A representative parameter generating means for generating representative parameters in a plurality of representative parameter circuit branches;

a triggering means operatively connected with said representative parameter generating means for generating a triggering signal; and an output means operatively connected with said representative parameter generating means for generating an output signal;

said representative parameters comprising a reference parameter generated in a reference parameter circuit branch and a plurality of characteristic parameters generated in a plurality of characteristic parameter circuit branches; said reference parameter circuit branch being coupled with a first circuit node;

each respective characteristic parameter circuit branch being responsive to a respective signed bit of said digital signal, each said respective bit being received via a respective bit line; each said respective characteristic parameter circuit branch being responsive to said respective bit to switchably couple a supply voltage and said first circuit node with a second circuit node when said respective bit is in a first state; to switchably couple said supply voltage with a fourth electrical node and to switchably couple said first circuit node with a third circuit node when said respective bit is in a second state; and to switchably couple said supply voltage with said third circuit node and to switchably couple said first circuit node with said fourth circuit node when said respective bit is in a third state;

each said respective characteristic parameter circuit branch generating a characteristic parameter representative of said respective bit;

said output means being operatively coupled with at least two circuit nodes of said second circuit node, said third circuit node, and said fourth circuit node;

said triggering means being operatively coupled with a reference source to receive a reference value and receiving said reference parameter from said representative parameter generating means, each respective representative parameter circuit branch of said plurality of representative parameter circuit branches responding to said trigger signal to enable said switchably coupling via said respective representative parameter circuit branch;

said triggering means generating said trigger signal and communicating said trigger signal to each said respective representative parameter circuit branch when said reference parameter and said reference value are related in a predetermined manner.

* * * * *